(12) United States Patent
Nishino

(10) Patent No.: US 10,362,201 B2
(45) Date of Patent: Jul. 23, 2019

(54) IMAGING APPARATUS, VEHICLE AND HOUSING

(71) Applicant: KYOCERA Corporation, Kyoto-shi, Kyoto (JP)

(72) Inventor: Tomoo Nishino, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/770,890

(22) PCT Filed: Aug. 31, 2016

(86) PCT No.: PCT/JP2016/003983
§ 371 (c)(1),
(2) Date: Apr. 25, 2018

(87) PCT Pub. No.: WO2017/072996
PCT Pub. Date: May 4, 2017

(65) Prior Publication Data
US 2018/0316831 A1  Nov. 1, 2018

(30) Foreign Application Priority Data
Oct. 26, 2015  (JP) .................................. 2015-210002

(51) Int. Cl.
*H04N 5/225* (2006.01)
*H05K 7/20* (2006.01)
(Continued)

(52) U.S. Cl.
CPC ........... *H04N 5/2252* (2013.01); *B60R 11/04* (2013.01); *G02B 7/02* (2013.01); *G03B 15/00* (2013.01);
(Continued)

(58) Field of Classification Search
CPC .... H05K 1/0201; H05K 1/0209; H05K 1/021; H05K 7/205; H05K 7/20509;
(Continued)

(56) References Cited

U.S. PATENT DOCUMENTS

2013/0093948 A1* 4/2013 Takeshita ............. H04N 5/2253
                                                           348/374

FOREIGN PATENT DOCUMENTS

JP  H06-252572  *  9/1994  ............. H01L 27/14
JP  H6-252572 A     9/1994
(Continued)

*Primary Examiner* — Twyler L Haskins
*Assistant Examiner* — Akshay Trehan
(74) *Attorney, Agent, or Firm* — Procopio Cory Hargreaves and Savitch LLP

(57) ABSTRACT

An imaging apparatus comprises a housing which includes a resin containing a plurality of fillers, each filler having a longitudinal direction, an imaging optical system fixed to an opening provided in the housing, and an imaging device stored in the housing and configured to capture an object image formed through the imaging optical system. the longitudinal directions of first fillers in a first part of the housing facing an exterior of the housing are positioned along a direction from the inside to the outside of the housing, and the longitudinal directions of second fillers in a second part of housing facing an interior of the housing are positioned along an interior wall of the housing.

11 Claims, 5 Drawing Sheets

(51) Int. Cl.
   *B60R 11/04* (2006.01)
   *H01L 27/14* (2006.01)
   *G02B 7/02* (2006.01)
   *G03B 15/00* (2006.01)
   *H05K 1/02* (2006.01)
   *H01L 27/146* (2006.01)

(52) U.S. Cl.
   CPC ........... *H01L 27/14* (2013.01); *H04N 5/2253* (2013.01); *H04N 5/2254* (2013.01); *H05K 7/2039* (2013.01); *H01L 27/14618* (2013.01); *H05K 1/0201* (2013.01)

(58) Field of Classification Search
   CPC .. H05K 7/2039; H04N 5/2252; H04N 5/2253; H04N 5/2254; B23P 15/26; B23P 2700/10; B60R 11/04; G02B 7/02; G03B 15/00; H01L 27/14
   USPC .................................................. 348/373–374
   See application file for complete search history.

(56) References Cited

FOREIGN PATENT DOCUMENTS

| | | | | | |
|---|---|---|---|---|---|
| JP | 2007-168263 | * | 7/2007 | ............. | H01L 27/14 |
| JP | 2007-168263 A | | 7/2007 | | |

* cited by examiner

IMAGING APPARATUS, VEHICLE AND HOUSING

CROSS-REFERENCE TO RELATED APPLICATION

The present application claims priority from and the benefit of Japanese Patent Application No. 2015-210002 filed on Oct. 26, 2015, the entire contents of which are incorporated herein by reference.

TECHNICAL FIELD

The present disclosure relates to an imaging apparatus, a vehicle having an imaging apparatus and a housing for an imaging apparatus.

BACKGROUND

In terms of the radiation performance, a technique of forming a housing of an electronic device by using a resin containing thermal conductive fillers has been known.

SUMMARY

An imaging apparatus according to an embodiment of the present disclosure comprises a housing which includes a resin containing a plurality of fillers, each filler having a longitudinal direction; an imaging optical system fixed to an opening provided in the housing; and an imaging device stored in the housing and configured to capture an object image formed through the imaging optical system. The longitudinal directions of first fillers in a first part of the housing facing an exterior of the housing are positioned along a direction from the inside to the outside of the housing. The longitudinal directions of second fillers in a second part of the housing facing an interior of the housing are positioned along an interior wall of the housing.

A vehicle according to an embodiment of the present disclosure comprises an imaging apparatus having a housing which includes a resin containing a plurality of fillers, each filler having a longitudinal direction; an imaging optical system fixed to an opening provided in the housing; and an imaging device stored in the housing and configured to capture an object image formed through the imaging optical system. The longitudinal directions of first fillers in a first part of the housing facing an exterior of the housing are positioned along a direction from the inside to the outside of the housing. The longitudinal directions of second fillers in a second part of the housing facing an interior of the housing are positioned along an interior wall of the housing.

A housing according to an embodiment of the present disclosure is a housing which includes a resin containing a plurality of fillers, each filler having a longitudinal direction. The longitudinal directions of first fillers in a first part of the housing facing an exterior of the housing are positioned along a direction from the inside to the outside of the housing. The longitudinal directions of second fillers in a second part of the housing facing an interior of the housing are positioned along an interior wall of the housing.

DETAILED DESCRIPTION

Embodiments of the present disclosure will be described below with reference to drawings.

Figure 1:
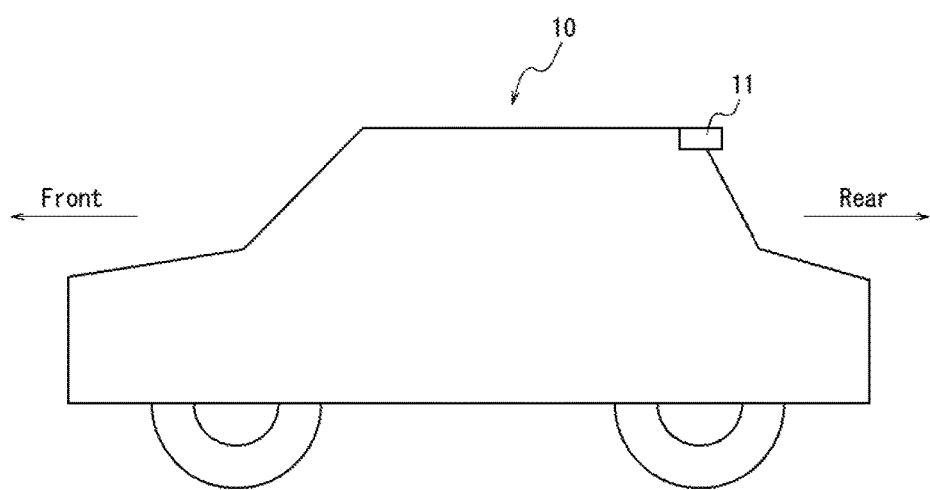
FIG. 1 is a diagram illustrating a vehicle having an imaging apparatus according to an embodiment of the present disclosure viewed from left.

A vehicle 10 according to an embodiment of the present disclosure will be described with reference to FIG. 1. The vehicle 10 is an automobile, for example, and travels according to an operation by a driver in the vehicle 10. The vehicle 10 has one or more imaging apparatuses 11. In this embodiment, an imaging apparatus 11 is disposed at the rear of the vehicle 10 so that it can capture the surrounding area behind the vehicle 10. The number and arrangement of the imaging apparatus 11 in the vehicle 10 may be optionally determined.

Figure 2:
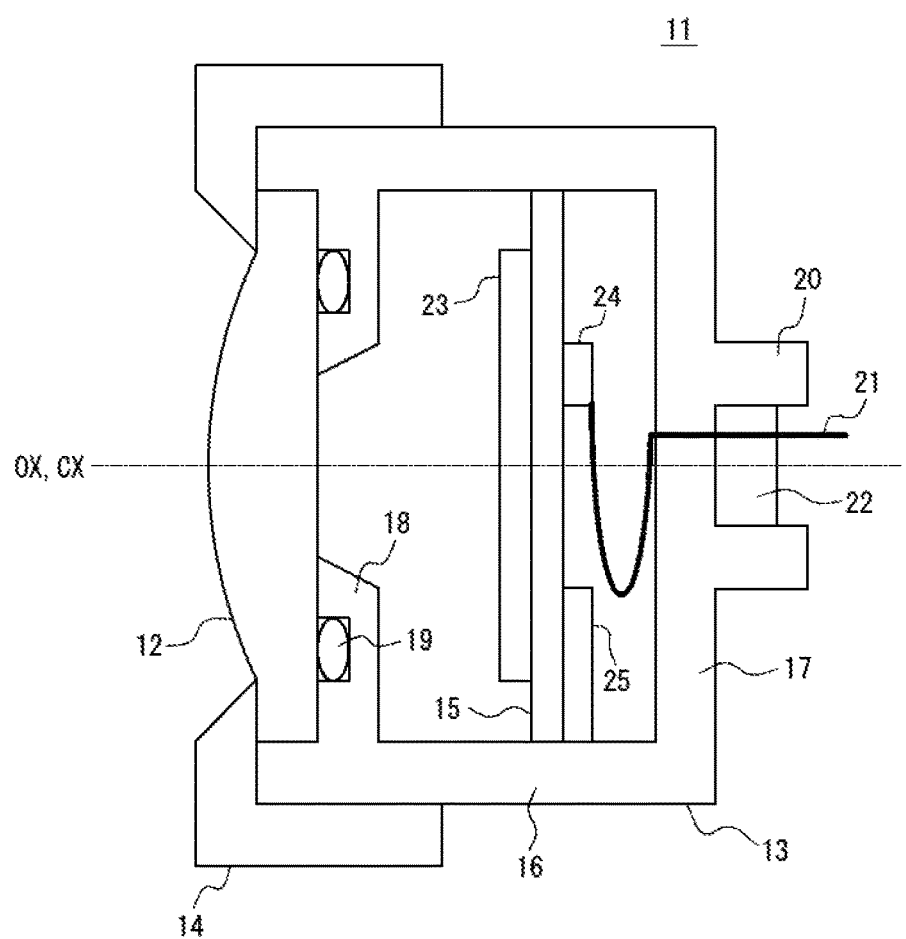
FIG. 2 is a cross sectional diagram along an optical axis illustrating a schematic configuration of the imaging apparatus including the housing.

Schematic configuration of the imaging apparatus 11 is described with reference to FIG. 2. The imaging apparatus 11 comprises an imaging optical system 12, a housing 13, a pressing member 14 and a substrate 15.

The imaging optical system 12 includes a diaphragm and one or more lenses. The imaging optical system 12 forms an object image. In FIG. 2, for clarity and convenience, the imaging optical system 12 is illustrated as a lens. One side of the imaging optical system 12 that is along the optical axis OX is defined as an object side and the other side is defined as an image side. As described later, the imaging optical system 12 is stored in and fixed to in the housing 13 such that the optical axis OX and the central axis CX of the housing 13 are approximately aligned with each other.

The housing 13 is molded by using a resin containing thermal conductive fillers. As a resin, polyamide (PA), polyphthal sulfide (PFS) and polyphthal amide (PA) can be employed, for example, but not limited thereto. The filler, the housing 13 and the molding method of the housing 13 are described in detail later. The housing 13 comprises a side wall 16 and a bottom wall 17.

The side wall 16 has a cylindrical shape along the central axis CX of the housing 13. A cylindrical interior wall 29 comes in contact with at least a part of an outer periphery of the imaging optical system 12 with the imaging optical system 12 stored in the housing 13. Thus, as described later, the side wall 16 defines a position of the imaging optical system 12 stored inward in the cylindrical radial direction with respect to the housing 13 in the direction perpendicular to the central axis CX. The bottom wall 17 is integrally formed with a first end of the side wall 16.

A seat 18 is formed at a second end (opening side) which is different from the first end of the side wall 16. The seat 18 is extended toward the center in the cylindrical radial direction. The seat 18 abuts the surface on the image side of the imaging optical system 12 with the imaging optical system 12 stored in and fixed to the housing 13. Thus the seat 18 together with the pressing member 14, described later, defines a position of the imaging optical system 12 stored in the housing 13 with respect to the housing 13 in the direction along the central axis CX.

A sealing member 19 is provided on the surface of the seat 18 that abuts the imaging optical system 12. The sealing member 19 is an annular elastic member such as an O-ring, for example. The sealing member 19 is deformed with the imaging optical system 12 stored in or fixed to the housing 13. The deformed sealing member 19 seals between the imaging optical system 12 and the seat 18.

As described above, the bottom wall 17 is formed at one end of the side wall 16. A projection 20 is formed on the bottom wall 17. The projection 20 is cylindrical along the central axis CX, for example, and is extended toward the outside of the housing 13. A through hole for a wiring 21 to go through, which is described later, is formed in the bottom wall 17 located inward in the cylindrical radial direction of the projection 20. As described later, a sealing member 22 provided at the wiring 21 is pressed fit to the inward in the cylindrical radial direction of the projection 20. The pressed fit sealing member 22 seals between the interior space and the exterior space of the imaging apparatus 11 in the inward in the cylindrical radial direction of the projection 20.

The pressing member 14 includes a retainer, for example. The pressing member 14 presses the imaging optical system 12 stored in the housing 13 from the object side to the seat 18. The imaging optical system 12 is fixed to the housing 13 through pressing the pressing member 14.

The substrate 15 is disposed stationary with respect to the housing 13 inside of the housing 13, that is, inward in the cylindrical radial direction of the side wall 16. The substrate 15 comprises an imaging device 23, a communication interface 24 and a controller 25.

The imaging device 23 includes a CCD imaging device or a CMOS imaging device, for example. The imaging device 23 captures an object image formed by the imaging optical system 12 and produces an image.

The communication interface 24 includes an interface configured to communicate with an external device through the wiring 21. In this embodiment, one end of the wiring 21 such as a conductor or a flexible substrate is inserted from outside to inside of the housing 13 through the aforementioned through hole formed in the bottom wall 17 of the housing 13. The one end of the wiring 21 is connected to the communication interface 24. After the wiring 21 is connected to the communication interface 24, the substrate 15 is disposed in the housing 13.

The controller 25 includes a general-purpose CPU that reads a processor specific to image processing such as DSP and a specific program to perform a specific function. The controller 25 applies specific image processing to output signals (captured images) from the imaging device 23. For example, specific image processing may include various types of image processing such as exposure adjusting processing, white balance processing, color interpolation processing, distortion correction processing, viewpoint conversion processing, segmentation processing, object recognition processing and the like.

Figure 3:
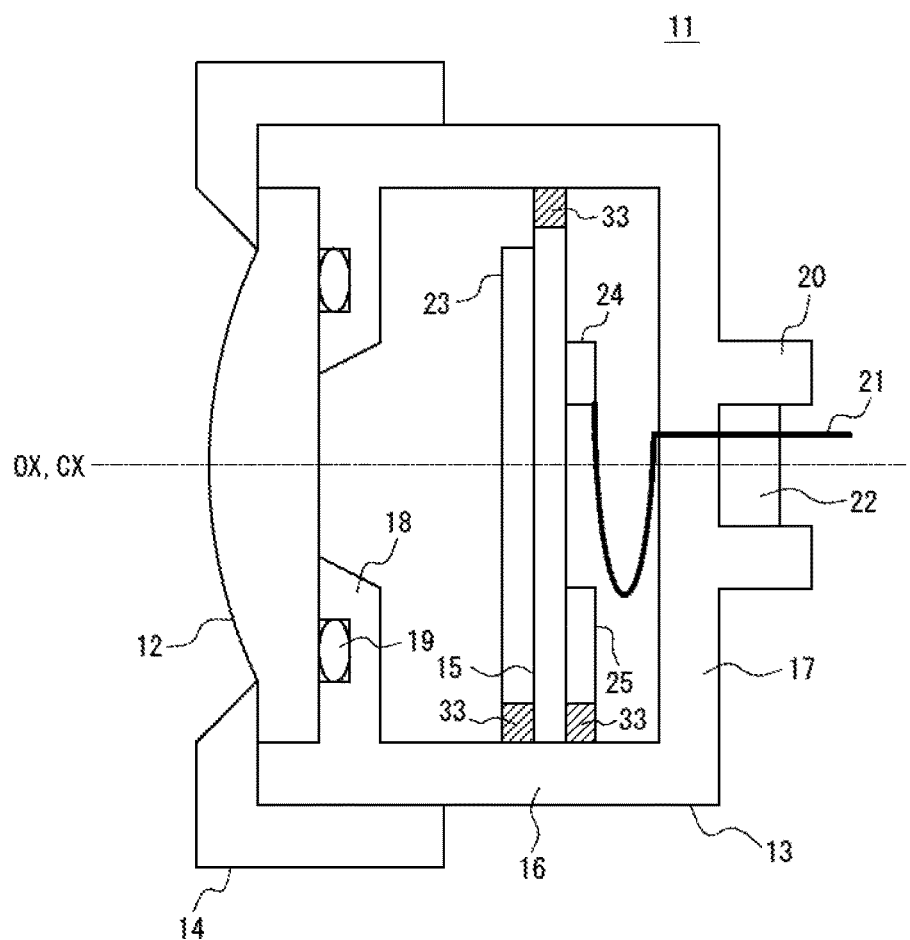
FIG. 3 is a cross sectional diagram along the optical axis illustrating a schematic configuration of the imaging apparatus according to a variant of the embodiment.

The aforementioned imaging device 23 and the controller 25 are heating elements that generate heat during operation. The imaging device 23 and the controller 25 are disposed in the interior space of the imaging apparatus 11 sealed by the aforementioned imaging optical system 12, housing 13 and sealing members 19, 22. Thus, the heat generated at the imaging device 23 and the controller 25 is released to the outside of the imaging apparatus 11 through the housing 13. In this embodiment, the heat generated at the imaging device 23 and the controller 25 is transferred to the housing 13 through the substrate 15 that is directly in contact with the interior wall 29 (e.g. inward in the radial direction of the side wall 16) of the housing 13. However, instead of the substrate 15, the imaging device 23 or the controller 25 may be disposed so as to directly come in contact with the interior wall 29 of the housing 13, or as illustrated in FIG. 3, for example, the imaging device 23, the controller 25 or the substrate 15 may come in contact with the interior wall 29 of the housing 13 through the thermal conducting member 33. The thermal conducting member 33 is formed by using any material having a relatively high thermal conductivity, such as metal, ceramic, organic material and the like.

The filler, the housing 13 and the molding method of the housing 13 are described in detail below.

The filler is a thermal conductive filler contained in a resin base material used for molding the housing 13. Any material having a higher thermal conductivity compared with that of the resin used for molding the housing 13, such as alumina (oxidized aluminum) or boron nitride, for example, can be employed for the filler. The filler has any shape that is long in one axial direction (longitudinal shape) such as a needle, a columnar or a plate shape. Hereinafter the axial direction is referred to also as a longitudinal direction of a filler. The longitudinal direction of the filler contained in a resin base material is approximately aligned with the resin flow direction when a resin is molded. Thus, when the heat is transferred to a molded resin, heat is transferred relatively easy in the resin flow direction, that is, the direction with which the longitudinal direction of filler is approximately aligned.

Figure 4:
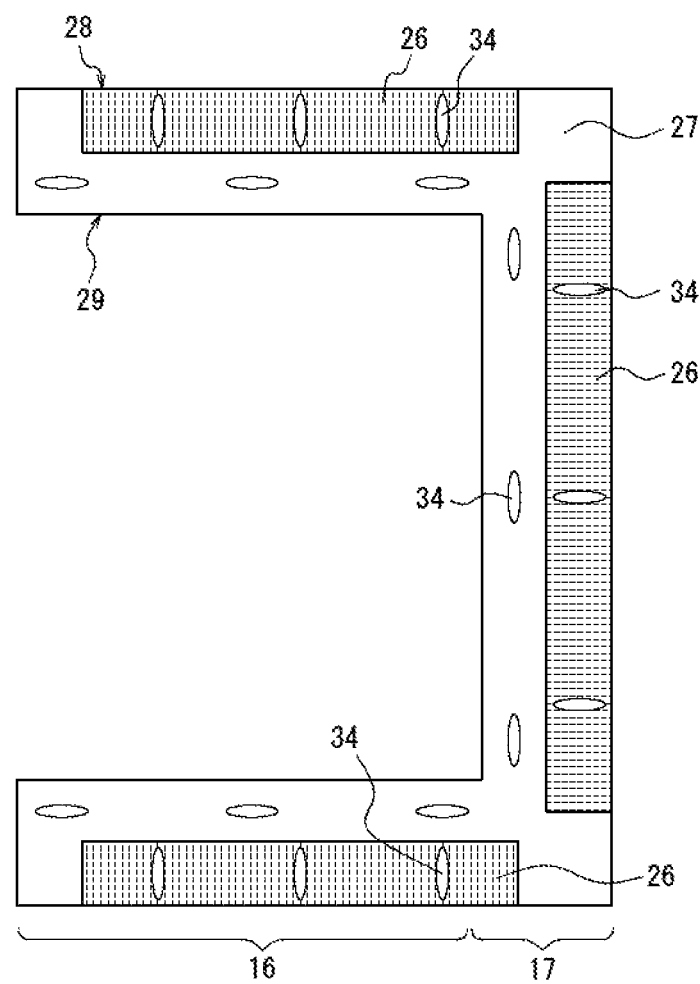
FIG. 4 is a cross sectional diagram illustrating a simplified configuration of the housing.

As described above, the housing 13 comprises the side wall 16 and the bottom wall 17. For clarity and convenience, as illustrated in FIG. 4, a configuration of the housing 13 that does not include the seat 18 and the projection 20 is described below. The housing 13 includes a first part 26 and a second part 27. The first part 26 is a part, facing the exterior of the housing 13, of at least one of the side wall 16 and the bottom wall 17. The first part 26 forms a part of an exterior wall 28 of the housing 13. The second part 27 is a part that faces the interior of the housing 13. The second part 27 forms the interior wall 29 of the housing 13.

As described later, a member (insert member) corresponding to the first part 26 is disposed in a mold when the second part 27 is molded, and the first part 26 and the second part 27 are integrally molded by an insert molding. As in the case of the second part 27, the insert member is molded with the aforementioned resin containing fillers. The housing 13 is molded such that the longitudinal direction of the filler 34 is positioned along the direction from the inside to the outside of the housing 13 in the first part 26 and the longitudinal direction of the filler 34 is positioned along the interior wall 29 of the housing 13 in the second part 27. In FIG. 4, the fillers 34 are schematically illustrated in a larger and more simplified form than the actual ones for explanation. In practice, many micro fillers 34 are dispersed in a resin in an approximately uniform manner. A molding method of the housing 13 that includes the first part 26 and the second part 27 is specifically described below.

The insert member corresponding to the first part 26 is described below. For example, a columnar bulk is molded by using a resin base material containing the aforementioned fillers. In molding a bulk, a gate is formed on columnar one end, for example, and a resin flows in the columnar longitudinal direction. Therefore, a bulk is molded in which the columnar longitudinal direction and the longitudinal direction of the filler are approximately aligned with each other. After the bulk is molded, the bulk is cut along a surface approximately perpendicular to the longitudinal direction of the bulk to obtain a plate-like insert member. Therefore, in the insert member, the longitudinal direction of the filler is positioned along the direction perpendicular to the plate-like surface.

Insert molding of the housing 13 by using the aforementioned insert member is described below. In this embodiment, the same filler and resin base material used for the insert member is used for molding the housing 13. However, a filler and a resin base material that are different from those used for the insert member may be used.

Figure 5:
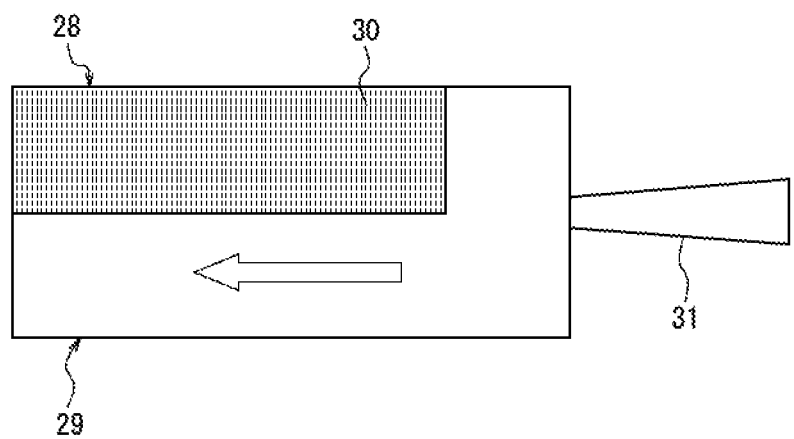
FIG. 5 is a cross sectional diagram of a main part in a mold during insert molding of the housing.

For example, as illustrated in FIG. 5, an insert member 30 is disposed in a mold used for molding the housing 13. Specifically, the insert member 30 is disposed in the mold such that the plate-like surface of the insert member 30 is exposed to the exterior of the housing 13 to be molded. Therefore, the insert member 30 forms a part of the exterior wall 28 of the housing 13 to be molded. After the insert member 30 is disposed, the resin base material is injected and is filled in the space inside the mold. The resin cured after filling forms the interior wall 29 of the housing 13.

The resin base material flowed through the gate 31 into the mold flows in the direction along the interior wall 29 of the housing 13 to be molded. Therefore, the longitudinal direction of the filler in the resin cured after filling is positioned along the interior wall 29 of the housing 13 to be molded.

In the housing 13 molded in the aforementioned manner, the insert member 30 forms the aforementioned first part 26. The resin cured after filling forms the aforementioned second part 27. Therefore, in the first part 26 facing the exterior of the housing 13, the longitudinal direction of the filler is positioned along the direction from the inside to the outside of the housing 13. On the other hand, in the second part 27 facing the interior of the housing 13, the longitudinal direction of the filler is positioned along the interior wall 29 of the housing 13.

As described above, the housing 13 of the imaging apparatus 11 according to this embodiment is molded by using a resin containing fillers. In the first part 26 facing the exterior of the housing 13, the longitudinal direction of the filler is positioned along the direction from the inside to the outside of the housing 13. On the other hand, in the second part 27 facing the interior of the housing 13, the longitudinal direction of the filler is positioned along the interior wall 29 of the housing 13. According to such configuration, the radiation performance of the housing 13 is improved as described below.

As described above, when resin molding is performed by using the resin base material containing fillers, the longitudinal direction of the fillers is aligned with the resin flow direction. Heat is transferred easily in the direction approximately aligned with the longitudinal direction of the filler. When a housing is molded according to the prior art, the resin base material flowing into the mold through the gate flows in the direction along the interior wall of the housing to be molded. Therefore, in the prior art, the longitudinal direction of the filler does not align with the direction from the inside to the outside of the housing, and thus sufficient radiation performance from the inside to the outside of the housing may not be obtained.

On the other hand, in the housing 13 according to an embodiment of the present disclosure, heat generated from the heating elements such as the imaging device 23 and the controller 25 stored in the housing 13 reaches the second part 27 facing the interior of the housing 13 first. Then, in the second part 27 in which the longitudinal direction of the filler is positioned along the interior wall 29 of the housing 13, heat is transferred along the interior wall 29 of the housing 13 to the entire interior wall 29 thereof. Subsequently heat is transferred from the second part 27 to the first part 26. Then, in the first part 26 in which the longitudinal direction of the filler is positioned along the direction from the inside to the outside of the housing 13, heat is transferred in the direction from the inside to the outside of the housing 13 and is released to the outside of the housing 13. Thus, heat is released to the outside of the housing 13 through the first part 26, and compared with the prior art, heat is easily transferred from the inside to the outside of the housing 13, and thus the radiation performance of the housing 13 is improved.

Further, when the imaging apparatus 11 is configured such that the heating element comes in contact with the interior wall 29 of the housing 13 directly or through the thermal conducting member 33, the radiation performance of the imaging apparatus 11 is further improved.

Moreover, when the imaging apparatus 11 is configured such that the substrate 15 including heating elements comes in contact with the interior wall 29 of the housing 13 directly or through the thermal conducting member 33, the radiation performance of the imaging apparatus 11 is further improved. In this case, the thermal conducting member 33 may have a thermal conductivity higher than that of the substrate 15.

Although the present disclosure has been described based on drawings and embodiments, it is to be noted that various changes and modifications will be apparent to those skilled in the art based on the present disclosure. Therefore, such changes and modifications are to be understood as included within the scope of the present disclosure. For example, the functions and the like included in the various members and steps may be reordered in any logically consistent way. Furthermore, components or steps may be combined into one or divided.

Figure 6:
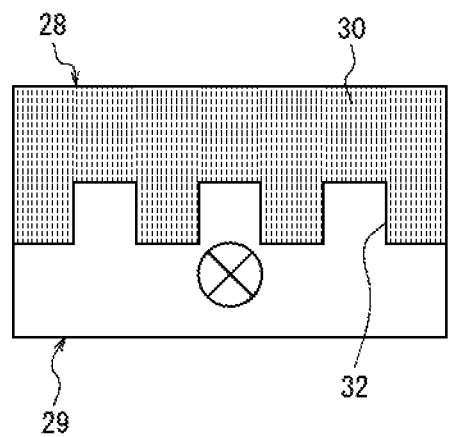
FIG. 6 is a cross sectional diagram of the main part in the mold during insert molding of the housing according to a variant.

For example, as illustrated in FIG. 6, in the aforementioned insert member 30, a groove 32 may be formed in the surface facing inward of the housing 13 to be molded. In FIG. 6, the resin base material flowing into the mold flows into and out of the page. The insert member 30 is disposed in the mold such that the extending direction of the groove 32 is approximately aligned with the flowing direction of the resin base material. Such configuration leads to an expansion of the contact area of the insert member 30 with the resin cured after filling and an improvement of the thermal conductivity. Thus the radiation performance of the housing 13 is further improved.

Further, the housing 13 according to the aforementioned embodiment is not limited to the imaging apparatus 11 mounted on the vehicle 10, and can be employed by various apparatuses that store heating elements.

The invention claimed is:

1. An imaging apparatus comprising:
   a housing which includes a resin containing a plurality of thermally conductive fillers, each thermally conductive filler having a shape with a longitudinal direction that is longer along one axis than any other axes through the thermally conductive filler;
   an imaging optical system fixed to an opening provided in the housing; and
   an imaging device stored in the housing and configured to capture an object image formed through the imaging optical system,
   wherein, on each of two or more sides of the housing, the longitudinal directions of first thermally conductive fillers in an exterior section of the housing, which faces an exterior of the housing are aligned with a first direction that is perpendicular to an exterior wall of the housing, and the longitudinal directions of second thermally conductive fillers in an interior section of the housing, which faces an interior of the housing, are aligned with a second direction that is parallel to an interior wall of the housing and perpendicular to the first direction.

2. The imaging apparatus according to claim 1, wherein the imaging device directly contacts the interior wall of the housing.

3. The imaging apparatus according to claim 1, further comprising a substrate that comprises a processor that processes output signals from the imaging device.

4. The imaging apparatus according to claim 3, wherein the substrate directly contacts the interior wall of the housing.

5. The imaging apparatus according to claim 3, wherein the substrate indirectly contacts the interior wall of the housing through a thermal conducting member.

6. The imaging apparatus according to claim 1, wherein the imaging device indirectly contacts the interior wall of the housing through a thermal conducting member.

7. The imaging apparatus according to claim 1, wherein the exterior section is an insert within the interior section.

8. A vehicle comprising:
an imaging apparatus having a housing which includes a resin containing a plurality of thermally conductive fillers, each thermally conductive filler having a shape with a longitudinal direction that is longer along one axis than any other axes through the thermally conductive filler;
an imaging optical system fixed to an opening provided in the housing; and
an imaging device stored in the housing and configured to capture an object image formed through the imaging optical system,
wherein, on each of two or more sides of the housing,
the longitudinal directions of first thermally conductive fillers in an exterior section of the housing, which faces an exterior of the housing, are aligned with a first direction that is perpendicular to an exterior wall of the housing, and
the longitudinal directions of second thermally conductive fillers in an interior section of the housing, which faces an interior of the housing, are aligned with a second direction that is parallel to an interior wall of the housing and perpendicular to the first direction.

9. The vehicle according to claim 8, wherein the imaging device contacts the interior wall of the housing directly or through a thermal conducting member.

10. The vehicle according to claim 8, further comprising a substrate that comprises a processor that processes output signals from the imaging device, wherein the substrate contacts the interior wall of the housing directly or through a thermal conducting member.

11. A housing, for electronic components of an imaging device, which includes a resin containing a plurality of thermally conductive fillers, each thermally conductive filler having a shape with a longitudinal direction that is longer along one axis than any other axes through the thermally conductive filler,
wherein, on each of two or more sides of the housing,
the longitudinal directions of first thermally conductive fillers in an exterior section of the housing, which faces an exterior of the housing, are aligned with a first direction that is perpendicular to an exterior wall of the housing, and
the longitudinal directions of second thermally conductive fillers in an interior section of the housing, which faces an interior of the housing, are aligned with a second direction that is parallel to an interior wall of the housing and perpendicular to the first direction.

* * * * *